(12) United States Patent
Paul et al.

(10) Patent No.: US 11,119,174 B2
(45) Date of Patent: Sep. 14, 2021

(54) METHOD FOR OBTAINING A CORRECTION FACTOR, STORAGE MEDIUM, AND MAGNETIC RESONANCE APPARATUS

(71) Applicant: Siemens Healthcare GmbH, Erlangen (DE)

(72) Inventors: Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 3 days.

(21) Appl. No.: 16/797,032

(22) Filed: Feb. 21, 2020

(65) Prior Publication Data
US 2020/0278412 A1 Sep. 3, 2020

(30) Foreign Application Priority Data
Feb. 28, 2019 (EP) .................................... 19160056

(51) Int. Cl.
*G01V 3/00* (2006.01)
*G01R 33/561* (2006.01)
(Continued)

(52) U.S. Cl.
CPC ..... *G01R 33/5616* (2013.01); *G01R 33/4835* (2013.01); *G01R 33/543* (2013.01);
(Continued)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

| 6,249,595 B1 * | 6/2001 | Foxall .............. G01R 33/56554 382/128 |
| 2013/0314090 A1 | 11/2013 | Taniguchi |
| 2019/0178965 A1 | 6/2019 | Paul |

OTHER PUBLICATIONS

Biermann, Judith, et al. "Image Based Correction of Radial Trajectory Shifts." Proceedings of the 22nd Annual Meeting of ISMRM. 2014. pp. 1545.

(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A storage medium, a magnetic resonance apparatus, and a method for obtaining a correction factor to balance a mismatch between gradient moments are disclosed herein. The method includes providing a magnetic resonance raw dataset, the generation of which includes acquiring the k-space of the magnetic resonance raw dataset in several partial measurements, wherein in each partial measurement, several k-space lines are at least partially sampled by setting a given set of acquisition parameters, applying at least one radio frequency excitation pulse, applying a first gradient in a predetermined direction, applying a second gradient in the predetermined direction, and reading out the magnetic resonance signals. The method further includes: changing the first gradient between at least two partial measurements; processing the magnetic resonance raw dataset several times to shifted raw datasets, each time using a different correction factor to shift the magnetic resonance signals in k-space in the predetermined direction; creating several magnetic resonance image datasets out of the shifted raw datasets; and determining the correction factor with respect to the image datasets.

17 Claims, 8 Drawing Sheets

(51) Int. Cl.
  *G01R 33/483* (2006.01)
  *G01R 33/54* (2006.01)
  *G01R 33/56* (2006.01)
  *G01R 33/565* (2006.01)
(52) U.S. Cl.
  CPC ..... *G01R 33/5608* (2013.01); *G01R 33/5617* (2013.01); *G01R 33/56554* (2013.01)
(58) Field of Classification Search
  USPC .......................................................... 324/309
  See application file for complete search history.

(56) References Cited

OTHER PUBLICATIONS

European Search Report for European Patent Application No. 19160056.8-1022 dated Aug. 28, 2019.
Porter, David A., and Robin M. Heidemann. "High resolution diffusion-weighted imaging using readout-segmented echo-planar imaging, parallel imaging and a two-dimensional navigator-based reacquisition." Magnetic Resonance in Medicine: An Official Journal of the International Society for Magnetic Resonance in Medicine 62.2 (2009): 468-475.
Rasche, Volker, Dietrich Holz, and Roland Proksa. "MR fluoroscopy using projection reconstruction multi-gradient-echo (prMGE) MRI." Magnetic Resonance in Medicine: An Official Journal of the International Society for Magnetic Resonance in Medicine 42.2 (1999): 324-334.

\* cited by examiner

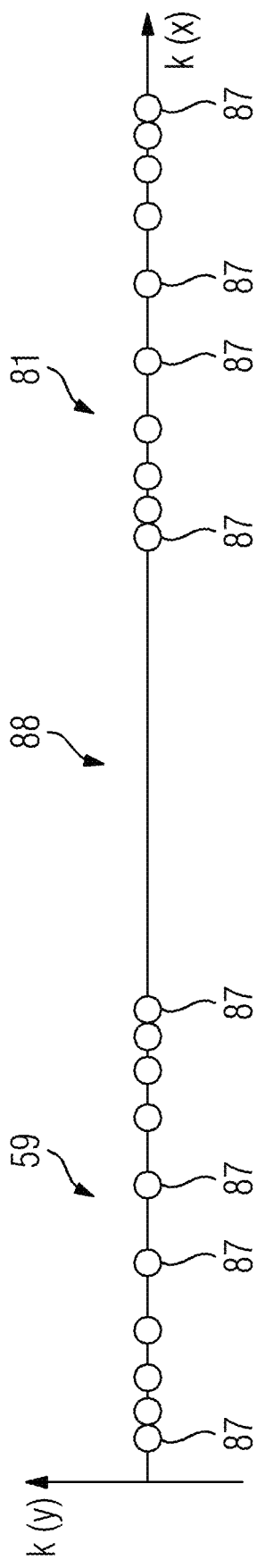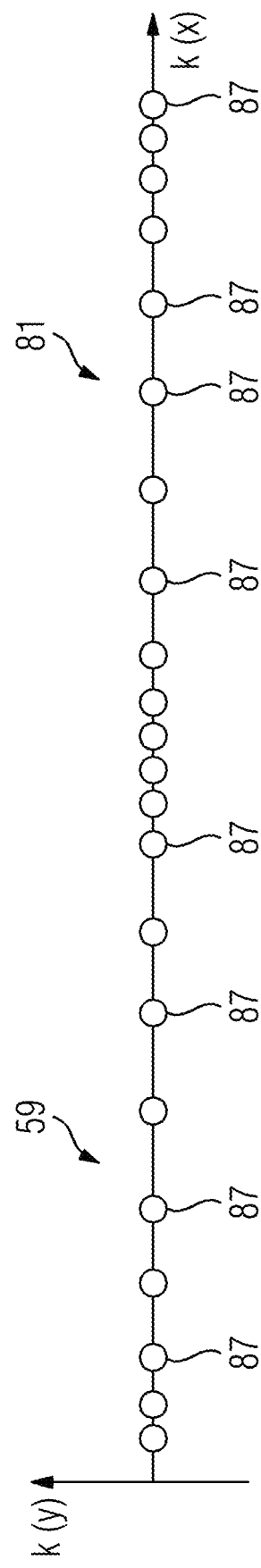

METHOD FOR OBTAINING A CORRECTION FACTOR, STORAGE MEDIUM, AND MAGNETIC RESONANCE APPARATUS

The present patent document claims the benefit of European Patent Application No. 19160056.8, filed Feb. 28, 2019, which is hereby incorporated by reference.

TECHNICAL FIELD

The present disclosure relates to methods, storage media, and magnetic resonance apparatuses for obtaining a correction factor to balance a mismatch between gradients.

BACKGROUND

It is known to gather correction parameters for nuclear magnetic resonance (NMR) or magnetic resonance imaging (MRI) experiments prospectively to optimize the results. For example, the resonance frequency is determined to maximize the resonance signal. Additionally, an adjustment of homogenizing currents, (called shimming), may be performed.

It is also known to provide correction factors for gradient strengths or moments. These correction factors balance a mismatch between an applied current and the resulting gradient field for given currents.

Furthermore, there may be gradient related correction factors which are sequence specific.

One sequence where sequence specific correction factors may be useful is the so-called RESOLVE sequence, (see, e.g., Porter and Heidemann, "High Resolution Diffusion-Weighted Imaging Using Readout-Segmented Echo-Planar Imaging, Parallel Imaging and a Two-Dimensional Navigator-Based Reacquisition," MRM, vol. 62, pp. 468-475, 2009). The RESOLVE sequence is readout-segmented and uses a sinusoidal readout gradient and hence is a sort of segmented echo planar imaging (EPI) sequence. Here, the segmentation is in readout direction in contrast to conventional multi-shot EPI sequences. A mismatch between the dephasing gradient in readout direction and the sinusoidal readout gradient leads to ringing artifacts.

To avoid the ringing artifacts, a correction factor is multiplied either to the dephasing gradient moment or the sinusoidal readout moment, e.g., to the duration or the gradient strength.

This correction factor may be obtained by varying several parameters, one of the parameters being the correction factor itself. Further parameters to be respected are the magnetic resonance apparatus type, the echo spacing, and the gradient orientation. Different magnetic resonance apparatus types have different gradient systems and radio-frequency (RF) coils inside, which affect the signal acquisition.

These parameters are specifically varied and for every set of parameters an image is acquired. The images may contain 128×128 or more data points. Hence, a large number of images has to be gathered, which are then compared with the naked eye or automatically by generating values characterizing the image quality. The image having the least artifacts determines the best correction factor. For every combination of parameters including echo spacing, gradient orientation, and all further relevant parameters, the best matching correction factor has to be found. The correction factor may be between 0.995 and 1.025.

Therefore, the adjustment of the correction factor is very time consuming and therefore is performed only once when the first magnetic resonance apparatus of a specific series is installed.

Furthermore, a mismatch of gradients may occur in phase encoding direction for example in turbo spin echo (TSE) sequences. There, the k-space may be segmented in phase encoding direction. A mismatch of the phase encoding gradient blips accumulates a phase error.

The problem may also occur in slice selection direction.

Even if the artifacts are balanced at the beginning of the lifetime of a MR-scanner, this may change due to deterioration of the material. Then, the artifacts change and may rise over the lifetime of the scanner.

This problem may occur when two gradients are applied in the same direction which affect the magnetization. It even gets worse when one or more of the gradients are applied several times in an excitation cycle.

SUMMARY AND DESCRIPTION

The scope of the present disclosure is defined solely by the appended claims and is not affected to any degree by the statements within this summary. The present embodiments may obviate one or more of the drawbacks or limitations in the related art.

There is a need for balance of a mismatch between gradients which may be achieved flexibly and without extending the time for a patient in the scanner.

These needs are satisfied in a method for obtaining a correction factor to balance a mismatch between gradients. The method includes providing a magnetic resonance raw dataset. The generation of the magnetic resonance raw dataset includes acquiring the k-space of the magnetic resonance raw dataset in several partial measurements, wherein, in each partial measurement, several k-lines are at least partially sampled by: setting a given set of acquisition parameters, applying at least one radio frequency excitation pulse, applying a first gradient in a predetermined direction, applying a second gradient in the predetermined direction, and reading out the magnetic resonance signals. The method further includes changing the first gradient between at least two partial measurements; processing the magnetic resonance raw dataset several times to shifted raw datasets, each time using a different correction factor to shift the magnetic resonance signals in the predetermined direction; creating several magnetic resonance image datasets out of the shifted raw datasets; and determining the correction factor with respect to the image datasets.

One aspect of the disclosure is to determine the correction factor retrospectively. This approach has several advantages. The measurement may be executed without further effort, which keeps the measurement time minimal. Further, the correction factor may be found patient specific or measurement specific, if wanted. If only a mismatch over longer time periods has to be balanced, the determination of the correction factor is to be done, e.g., every six months.

Additionally, the correction factors may be provided if the correction factors made available by the scanner do not cover the acquisition parameters in use.

To get the correction factor retrospectively, the correction factor is determined after the MRI measurement. This is based on the finding that a mismatch of gradients here causes a shift in k-space, which may be corrected afterwards.

With regard to the signal acquisition, some features are explained further below.

A set of parameters may refer to a set of values to be used while executing a scan. This may include the duration of an RF pulse, a delay, the RF frequency, the echo time, the repetition time, etc.

An excitation pulse is used to excite the magnetization. The flip angle of the excitation pulse may be between 0° and 90°. With regard to spin echo sequences and gradient echo sequences, the flip angle is exactly 90°. Fast gradient echo sequences may have smaller flip angles. The excitation pulse also is used to define the length of the repetition time TR, which is the length of one excitation cycle. Every scan sequence has at least one excitation pulse, otherwise there is no signal.

An excitation cycle may be also called partial measurement. In a partial measurement, a part of the k-space is sampled. In particular, a segmented measurement has several partial measurements. For example, a TSE measurement is segmented in phase encoding direction if the k-space is not sampled in one shot but in several acts.

Furthermore, the RESOLVE sequence as presented above is a readout-segmented EPI. This segmentation is caused by a readout gradient having a particular shape being of a sinusoidal form and covering only a small part of the k-space in readout direction while shifting between segments occurs by a dephasing gradient.

The first gradient may be a dephasing gradient in readout direction. This is a well-known gradient to prepare a gradient echo signal, which is formed together with the so-called readout gradient.

Advantageously, the second gradient is the readout gradient. The readout gradient is being applied while reading out the echo signals. It encodes the signal in readout direction.

If the dephasing gradient and the readout gradient, which both are applied in readout direction, do not fit to each other perfectly, there is a mismatch between them. This mismatch may retrospectively be balanced by a correction factor.

In a further embodiment, the second gradient may be applied several times in a partial measurement. In particular, the second gradient may be used to generate an echo train, or the second gradient may be used while generating an echo train. The second gradient being a readout gradient means alternating its sign to create a gradient echo train. Alternatively, the second gradient may be applied several times having the same sign in phase encoding direction before the echo signals are read out. This may be the case when using an EPI sequence.

All in all advantageously an echo train having a plurality of echo signals is acquired in every partial measurement. There may be up to dozens of echo signals in an echo train. For example there may be between 40 and 50 echo signals.

Moreover all echo trains may have the same number of echo signals. That simplifies the processing of the data.

The readout gradient may have a sinusoidal form having at least one arc. Then the k-space may be sampled segmented in readout direction.

The gradient moments or the extreme values of the arcs may have constant values. Then a possible mismatch is constant and sums up to a final mismatch for every use of the second gradient. The mismatch may then be assumed for every point in k-space.

The k-space signals of one partial measurement may partially cover the k-space in readout direction. The segmentation is then at least in readout direction and may be additionally in phase encoding and/or slice selection direction.

Advantageously, the k-space signals of one partial measurement cover the k-space in phase encoding direction completely. Then, the segmentation is solely in readout direction.

Alternatively, the segmentation may be solely in phase encoding direction.

K-space lines may be acquired with the same gradient moment in phase encoding direction are combined to a combined k-space line. This may be done if the k-space is segmented in readout direction.

Advantageously, the k-space is acquired by Cartesian sampling. In this process, lines or parts of lines are sampled which are ordered parallel in k-space.

The echo signals or magnetic resonance signals, respectively, are shifted, (e.g., stretched or compressed), in k-space to correct the mismatch of the gradients. This shift may be done for every data point of a k-space line individually even if only one correction factor is used: starting at a starting point where the position is assumed to be correct, which may be at the beginning of a line. Then, the distance to the starting position may be varied by multiplying the distance to the starting point in the predetermined direction with the correction factor. Doing so, the k-space line is stretched if the correction factor is bigger than 1 or compressed if the correction factor is smaller than 1. It should be noted that the starting point also lies in the same k-space line as the shifted magnetic resonance signals, there is no distance in further directions. The correction factor may be used to compensate an assumed mismatch retrospectively. This creates shifted raw datasets, one for every correction factor.

In a further embodiment, the shifted raw datasets are gridded to k-space. The echo signals are related to k-space-points. If the sampling scheme and/or the multiplication with the correction factor causes a difference between the position of acquisition and the needed position, a reorganization is necessary. This is called gridding because the k-space points of one grid are transferred to a Cartesian grid.

Whether there is a radial sampling scheme or a Cartesian sampling scheme, the k-space data points, (e.g., the echo signals), are gridded with regard to the correction factor in use.

Advantageously, all k-space lines or all partial k-space lines are gridded using the same correction factor when creating one image. That means that the mismatch is not caused by accidental but by reproducible deviations.

Moreover, the echo signals may be acquired overlapping in k-space, (e.g., in readout direction). Alternatively or additionally, the signals may overlap in phase encoding and/or slice selection direction. The echo signals may overlap in these directions in which the segmentation takes place. Then, the k-space is covered even if the k-space lines are compressed. Then, the SNR is better after the gridding act.

Alternatively or additionally, the first gradient and the second gradient may be applied in phase encoding direction. Then, the k-space signals of one partial measurement cover the k-space in phase encoding direction partially. Furthermore, the echo signals may overlap in k-space in phase encoding direction.

The correction factor to be used may lie between 0.995 and 1.025. The overlap may then be defined in a way that even with a correction factor of 0.995 the k-space is covered completely.

Advantageously, the proposed method may be used additionally to a correction factor already applied on the gradient moments during the acquisition of the raw dataset. As discussed above, this correction may get to be not sufficient over the years or in specific situations. The existence of factors used to calculate gradient strengths or durations during measurement does not prevent the use of the method disclosed herein.

Advantageously, at least one navigator echo signal is acquired after the acquisition of an echo train. Navigator echo signals may be used to eliminate phase errors caused by pulsation when applying diffusion gradients. Moreover, the readout gradient of the navigator echoes also may have a sinusoidal form.

To determine the best matching correction factor, the raw dataset is processed to a set of images each of them being generated using a different value for the correction factor. As mentioned above, the correction factor lies between 0.995 and 1.025.

After having created several magnetic resonance image datasets out of the shifted raw datasets, the correction factor for current and/or further use has to be determined. This is done by choosing the image having the least artifacts. In certain examples, the image having the least artifacts may be found automatically. To do so, it may be foreseen to count the number of edges found in lines and to choose the image having the lowest number of edges. This determines the correction factor. Alternatively, the artifact energy may be calculated. Then, the image having the least energy determines the correction factor.

To improve the determination of the correction factor, a spherical phantom filled with doped water may be used as sample. This produces a constant signal, wherein artifacts may then easily be identified.

In accordance with another aspect, a magnetic resonance apparatus is disclosed. The magnetic resonance apparatus includes an MR data acquisition scanner including a radio-frequency transmitter and an RF receiver and a gradient coil arrangement. The magnetic resonance apparatus further includes a memory in which parameter sets are stored and a computer having access to the memory and configured to read the parameter sets from the memory. The computer is configured to carry out the method described above.

Each embodiment described with regard to the method may also be realized in the magnetic resonance apparatus.

In accordance with another aspect, a non-transitory computer-readable data storage medium encoded with programming instructions is disclosed. The storage medium is configured to be loaded into a computer system of a magnetic resonance (MR) apparatus that includes an MR data acquisition scanner having a radio-frequency (RF) transmitter, an RF receiver, a gradient coil arrangement, and a memory. The programming instructions, when executed, are configured to cause the computer system to carry out the methods described above.

Each embodiment described with regard to the method also may be realized in the data storage medium.

BRIEF DESCRIPTION OF THE DRAWINGS

Further details of the disclosure are provided below based on the figures.

Parts that correspond to one another are labeled with the same reference characters in all figures.

FIG. 8 depicts an example of two compressed k-space lines.

FIG. 9 depicts an example of two stretched k-space lines.

DETAILED DESCRIPTION

Figure 1:
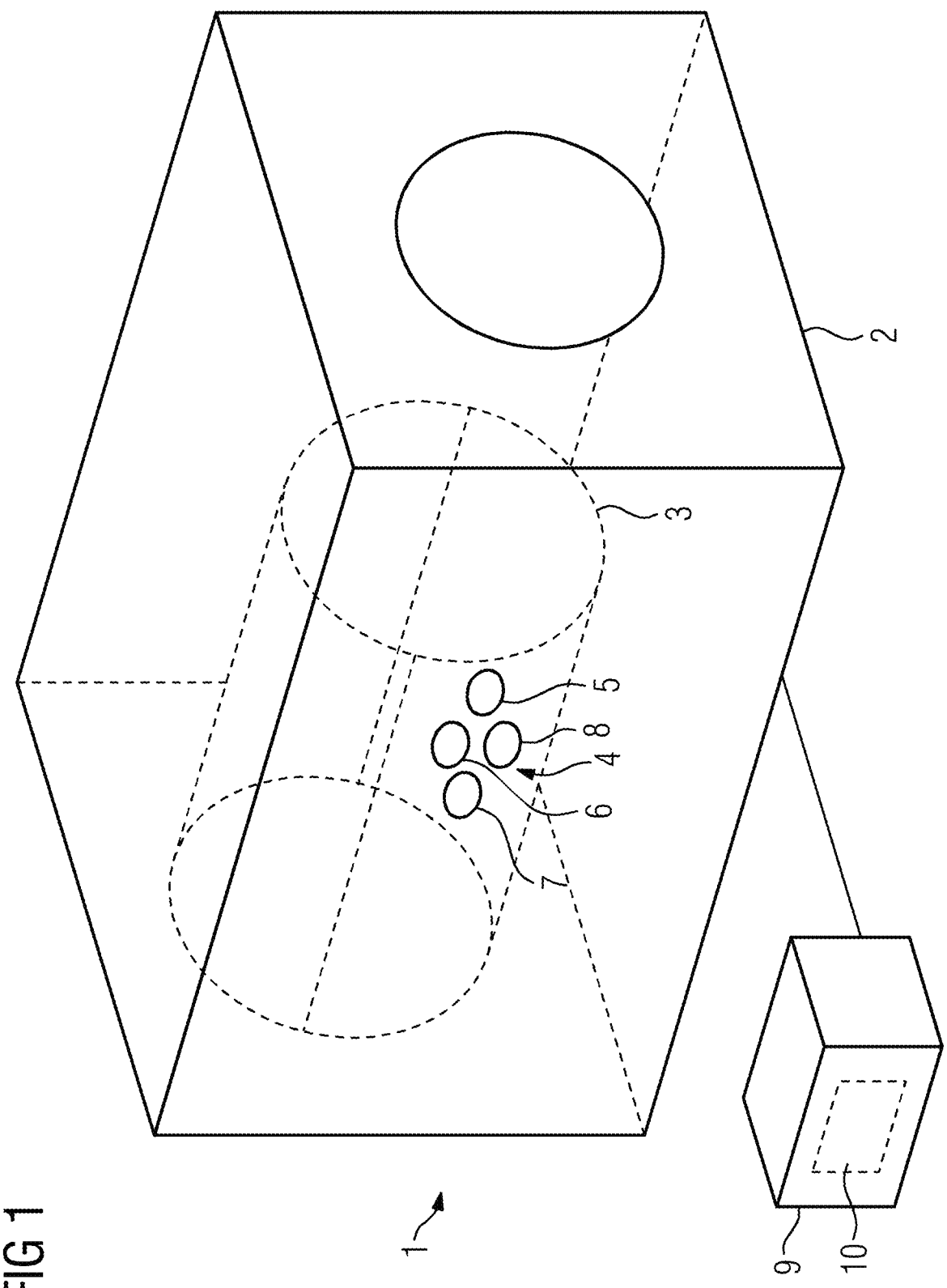
FIG. 1 depicts an embodiment of a magnetic resonance apparatus.

FIG. 1 depicts a magnetic resonance apparatus 1. The magnetic resonance apparatus 1 has a scanner 2. A transmit coil arrangement 3 is part of the scanner 2. The transmit coil arrangement 3 may be configured as a body coil, and thus includes a single coil.

Furthermore, the magnetic resonance apparatus 1 has a reception coil arrangement 4. The reception coil arrangement 4 is a coil array with coils 5, 6, 7, and 8. To enable the coils 5, 6, 7, and 8 to be distinguished more easily, the transmit coil arrangement 3 is shown by a dashed outline.

A control computer 9 controls the operation of the magnetic resonance apparatus 1.

The magnetic resonance apparatus 1 also has a non-transitory data storage medium 10 as part of the control computer 9 or independent thereof, on which computer code for carrying out magnetic resonance measurements is stored.

The coil array 4 is used only to read out the measurement signal which may be an echo signal. The coils 5, 6, 7, and 8 of the coil array 4 read out the measurement signal at the same time. Instead of the coil array 4, an individual coil may also be used as the detection coil for individual embodiments disclosed herein.

Further components of the magnetic resonance apparatus 1, such as gradient coils and a patient bed are not shown, for clarity.

Figure 2:
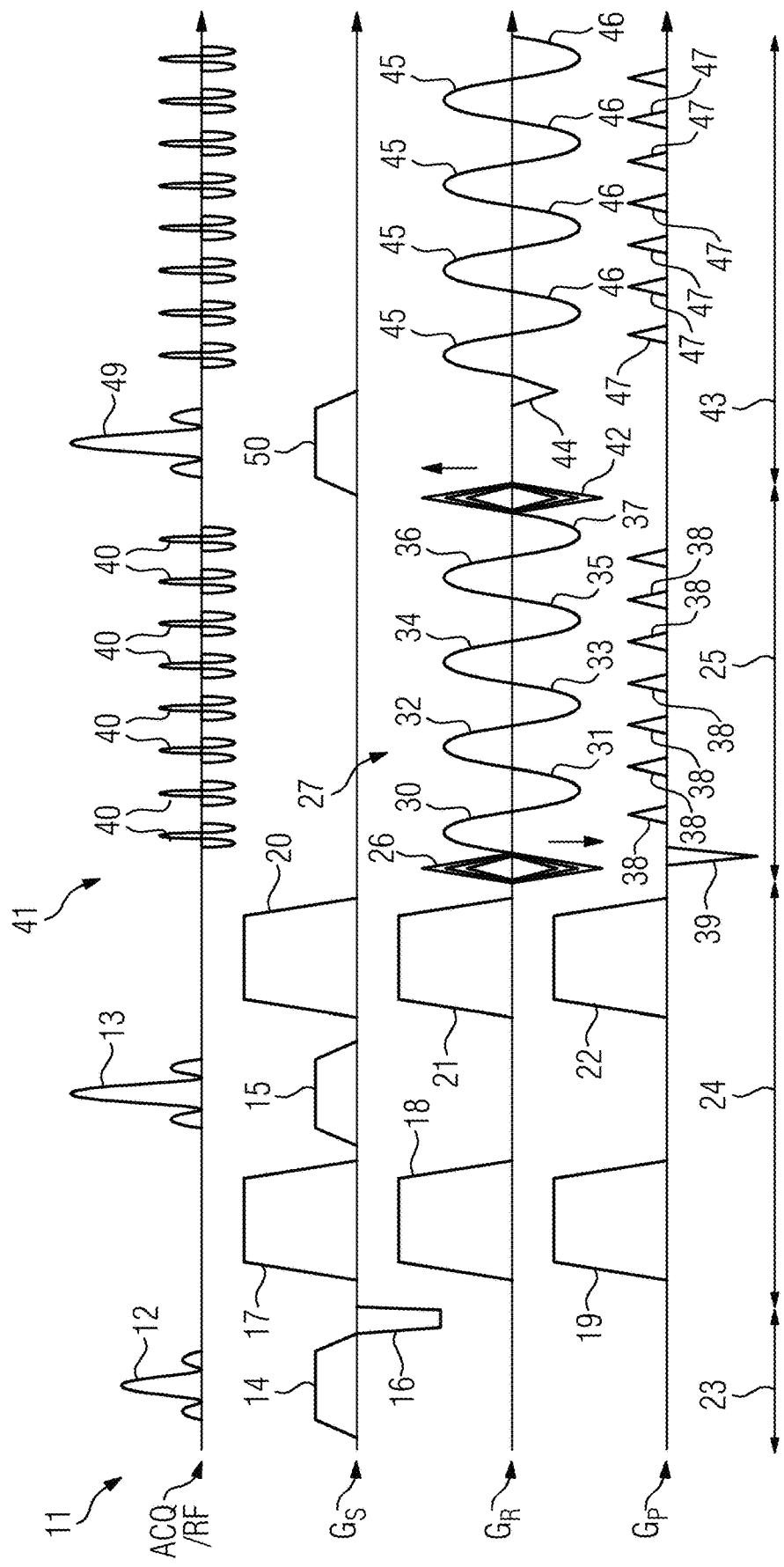
FIG. 2 depicts a sequence diagram of a RESOLVE sequence (prior art).

FIG. 2 depicts a sequence diagram 11 of a RESOLVE sequence which is known, for example, from Porter and Heidemann, "High Resolution Diffusion-Weighted Imaging Using Readout-Segmented Echo-Planar Imaging, Parallel Imaging and a Two-Dimensional Navigator-Based Reacquisition," MRM, vol. 62: pp. 468-475, 2009.

A diffusion preparation section includes an excitation pulse 12 and a refocusing pulse 13. Slice selection gradients 14 and 15 are applied at the same time to select a defined slice in a patient. It is known to use an additional slice rephasing gradient 16 to compensate the dephasing fraction of the slice selection gradient 14. The diffusion encoding gradients 17, 18, and 19 before the refocusing pulse 13 and the respective gradients 20, 21, and 22 are also basically known.

The excitation pulse 12 and the gradients 14 and 16 are part of an excitation phase 23 of the RESOLVE sequence. The following evolution phase 24 lasts to the end of the diffusion gradients 20, 21, and 22.

After that, the readout phase 25 starts. A dephasing gradient 26, having different gradient moments by varying its strength, puts the beginning of the readout in the readout direction to a desired position in k-space. This is shown in the following figure.

A sinusoidal readout gradient 27 has a plurality of arcs 30, 31, 32, 33, 34, 35, 36, and 37. Every arc 30, 31, 32, 33, 34, 35, 36, and 37 encodes one partial line in a readout direction in the k-space.

The phase encoding gradients 38 shift the encoding for one act in phase encoding direction. Therefore, the phase encoding gradients 38 are called blips or gradient blips.

An initial phase encoding gradient 39 puts, similar to the dephasing gradient 26, the beginning of the readout in the phase encoding direction to a desired position in k-space.

In the readout phase 25, all echo signals 40 of one so called segment may be acquired. All signal echoes of an excitation cycle generate an echo train 41. At the end of the readout phase, the encoding is put back to the starting point by applying a gradient 42 which has the same gradient moment as the dephasing gradient 26 but the opposite sign.

After the readout phase 25, a navigator phase 43 follows. The respective gradients 44, 45, 46, and 47 operate as described with regard to the readout phase 25. The echo signals 48 are generated using a refocusing pulse 49 and a slice selection gradient 50.

Figure 3:
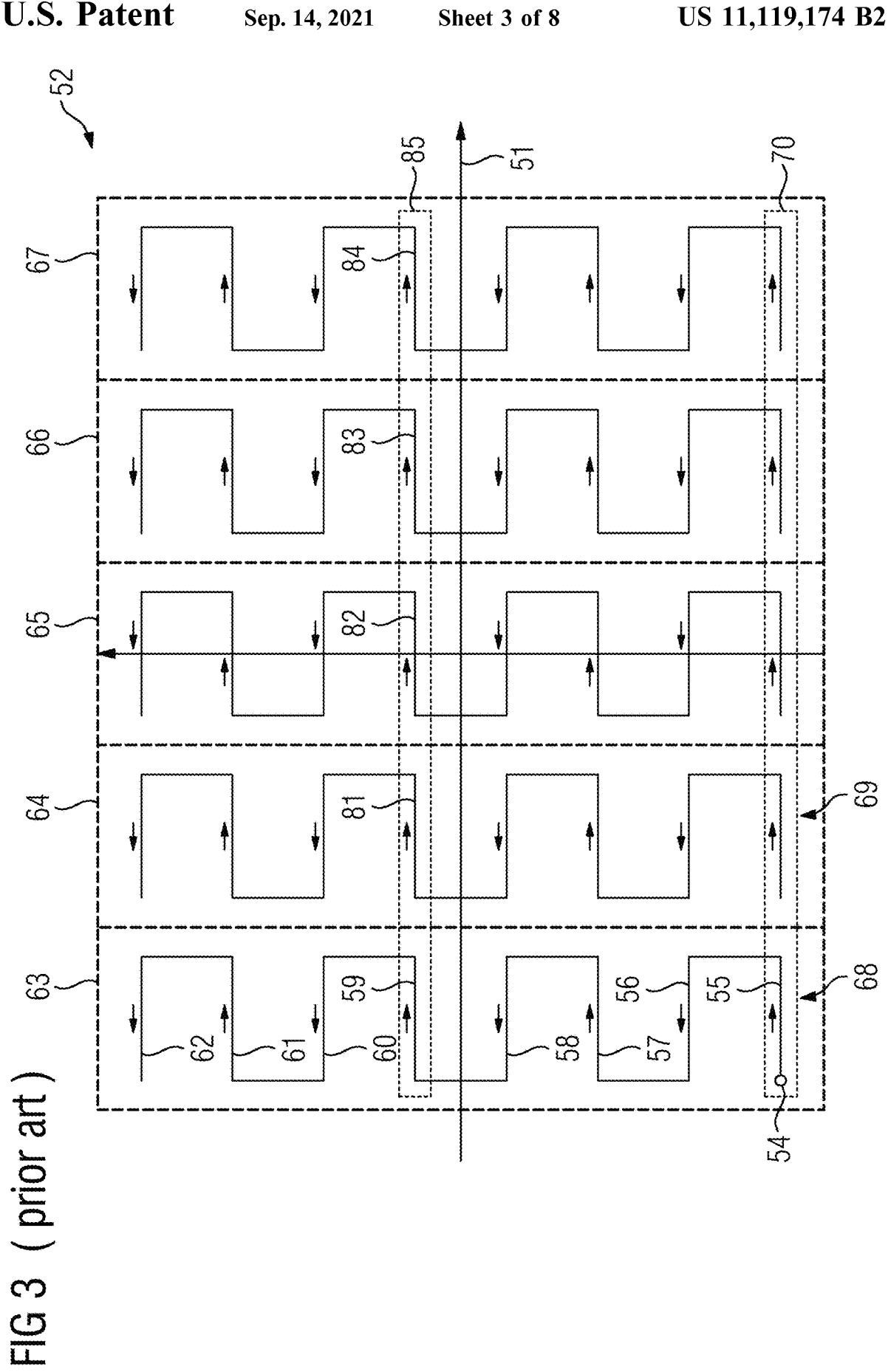
FIG. 3 depicts a k-space acquisition scheme of a RESOLVE sequence (prior art).

FIG. 3 depicts a k-space acquisition scheme used by the sequence 11. An axis 51 denotes the k(x) direction of the k-space 52 and an axis 53 the k(y) direction. The k(x) direction is also called readout direction and the k(y) direction phase encoding direction.

After the preparation of the signal, (e.g., by diffusion weighting), the gradients 26 and 39 put the encoding to the first starting point 54. This is, as discussed above, a possible starting point for stretching/compressing the partial line 55. The partial line 55 is acquired while the arc 30 is applied, the partial line 56 at the same time as the arc 31 applied. The shift in phase encoding direction is achieved by one of the blips 38.

The additional partial lines 57, 58, 59, 60, 61, and 62 are created in the same way. The partial lines 55 to 62 or echo signals 40 constitute an echo train 41.

The partial lines 55 to 62 cover a segment 63 of the k-space 52, which is separated in k(x) direction.

Applying the sequence 11 by using a dephasing gradient 26 having a different gradient moment allows the acquisition of the echo signals of one the segments 64, 65, 66, or 67 of the k-space 52.

If an echo train 41 has all echo signals of a segment 63 to 67 of the k-space 52, a number of excitation cycles is needed that is the number of segments the k-space 52 has.

If an echo train 41 has only a fraction of the echo signals of a k-space segment, the excitation cycle has to be repeated more often. Then, the k-space 52 was divided in readout direction and phase encoding direction.

The trajectories 68 and 69 of two adjacent segments, e.g., the parts 63 and 64, have a gap for the sake of clarity. In reality, the echo signals of a k-space line cover the k-space 52 totally without gaps.

Images are reconstructed using the echo signals of all excitation cycles having the same position in phase encoding direction as one k-space line.

Figure 4:
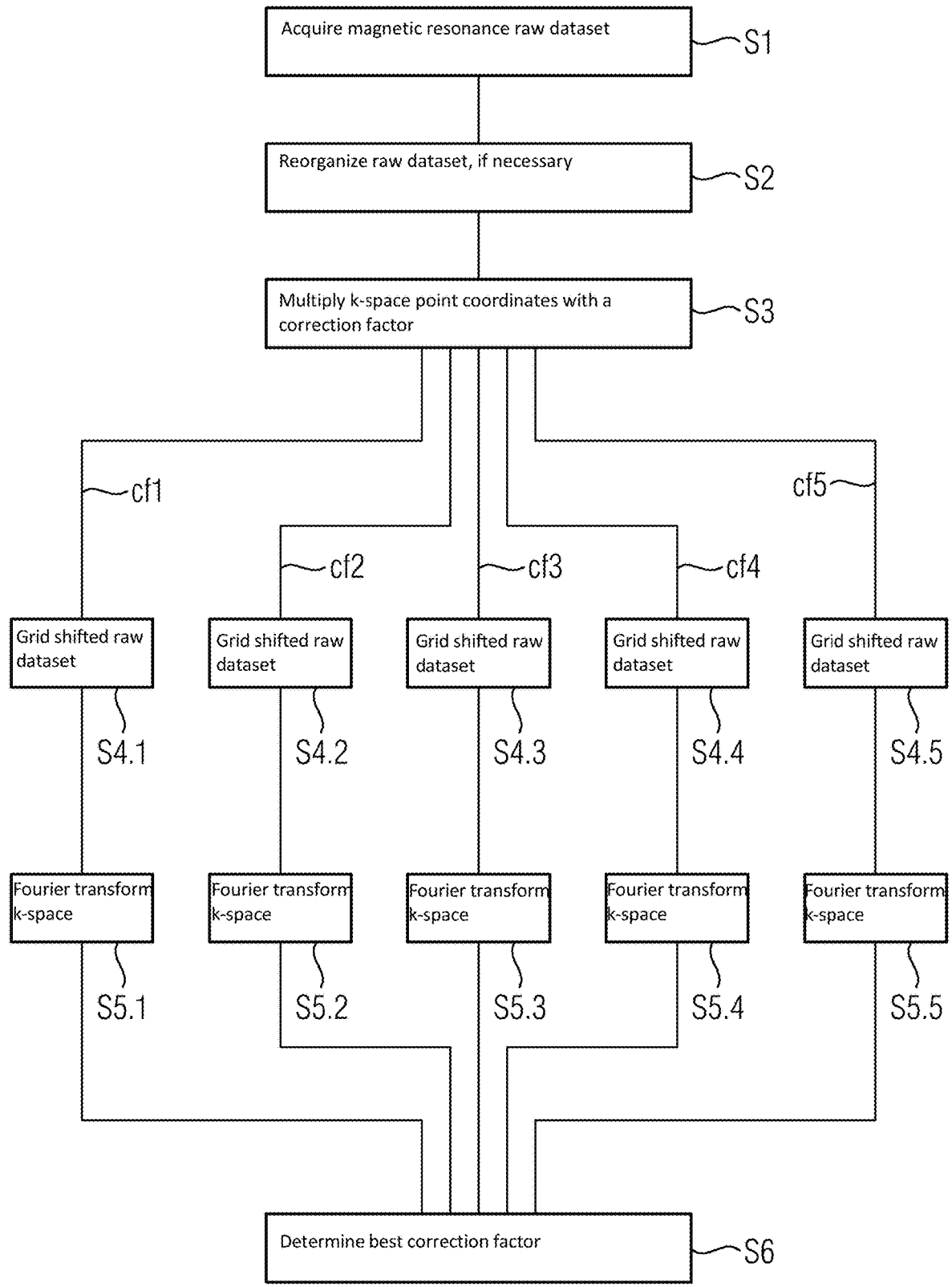
FIG. 4 depicts an exemplary flowchart of a method of determining a correction factor to balance a mismatch between two gradients.
Figure 5:
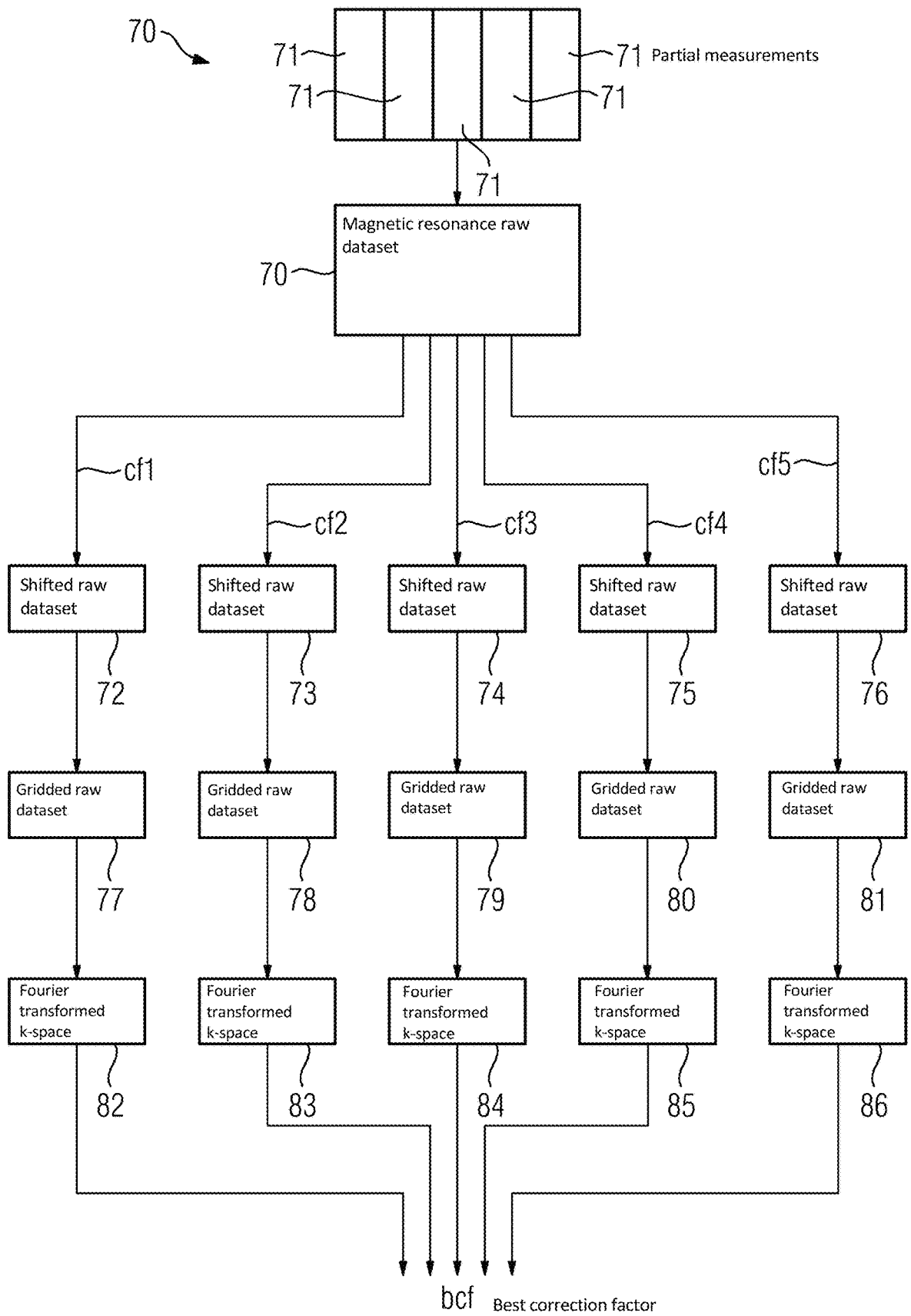
FIG. 5 depicts an example of respective results of the acts according to FIG. 4.

FIG. 4 depicts a flowchart of a method of determining a correction factor to balance a mismatch between two gradients. FIG. 5 depicts respective results of the acts according to FIG. 4.

In act S1, a magnetic resonance raw dataset 70 is acquired using the RESOLVE sequence according to FIG. 2 by executing several partial measurements 71. In each partial measurement 71, one of the segments 63 to 67 is sampled. The segments 63 to 67 all overlap slightly to the left and right side.

In act S2, the magnetic resonance raw dataset 70 is reorganized if necessary. For example, some of the partial lines 55 to 62 have to be mirrored or the order of the lines has to be corrected.

In act S3, all k-space point coordinates corresponding to the partial lines are multiplied with a correction factor cf1, cf2, cf3, cf4, or cf5. This is motivated as follows: If the readout gradient 27 is too strong, a correction factor cf<1 would be applied to a gradient moment to get the right gradient moment if it was multiplied prospective. Because the readout gradient 27 is stronger than it should be, the sampled k-space is broader than it should be. Then, a retrospective multiplication of the k-space point coordinates assuming the starting point having the right position corrects the data in the same way as the prospective multiplication to the gradient moments.

Thereby, only one correction factor is used per image to be processed and as many images are processed as correction factors are used. For example, five different correction factors cf1, cf2, cf3, cf4, and cf5 are used to create five different shifted raw datasets 72, 73, 74, 75, and 76. Act S3 is new and allows the retrospective application of correction factors.

Using a RESOLVE sequence, the correction factors are applied in readout direction. Correction factors>1 stretch the k-space lines in readout direction, while correction factors<1 compress the k-space lines in readout direction.

The shifted raw datasets 72 to 76 are then gridded to k-spaces 77 to 81 having Cartesian grids in acts S4.1 to S4.5. Acts S4.1 to S4.5 are necessary. There only the shift or additionally a non-Cartesian sampling scheme may be respected.

In acts S5.1 to S5.5, the k-spaces 77 to 81 are Fourier transformed to images 82, 83, 84, 85, and 86.

The best correction factor bcf is then determined in act S6 by using the naked eye or by calculating it as described above.

Figure 6:
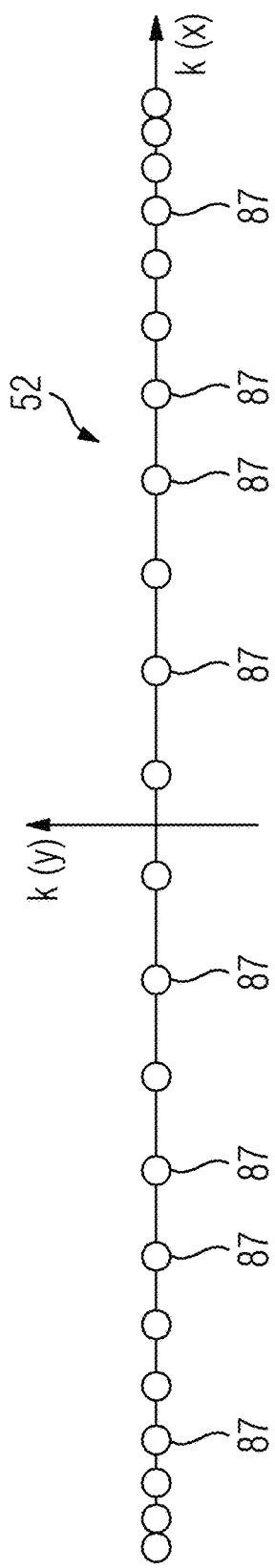
FIG. 6 depicts an example of a partial k-space line.

FIG. 6 depicts one of the partial lines 55 to 62. Because the sampling density varies, which means the k-space points 87 have different distances, the k-space points 87 have to be gridded to a Cartesian grid. The k-space points 87 of a partial line represent one of the measured echo signals 40.

Figure 7:
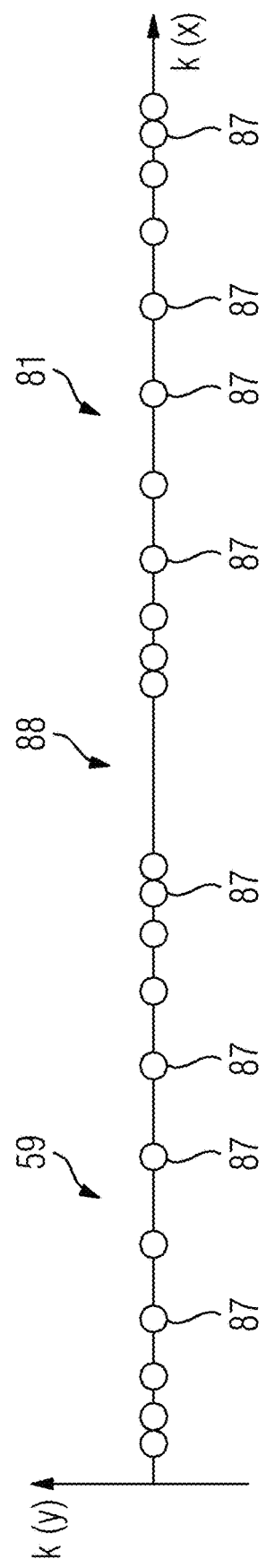
FIG. 7 depicts an example of two adjacent k-space lines.

FIG. 7 depicts two partial lines 59 and 81 of two adjacent segments 63 and 64 without application of a correction factor. The readout gradient 27 has been weaker than assumed and therefore after act S4 there is a gap 88 between the segments 63 and 64. This gap is shown exaggerated to clearly show the effects.

FIG. 8 depicts the same partial lines 59 and 81 if a correction factor cf<1 is applied. Then, the gap 88 is worse than before and leading to worse ringing artifacts.

FIG. 9 depicts the partial lines 59 and 81 if a correction factor cf>1 and, in particular, the best correction factor is applied. Then, the gap 88 has disappeared and the k-space point are perfectly positioned.

It has to be noted that, for every partial line, the starting point is the first point on the left side. The starting point 54 of a segment is—for the presented sampling scheme—in the lowest line on the left side. The trajectories are then as described. Therefore, the mismatch rises to the right side of a partial line and is then reduced again because the readout gradient 27 has changed its sign. Therefore, for the given sampling scheme the starting point to calculate distances is the first point on the left side. Then, the stretching and compression of all partial lines looks the same as in FIGS. 8 and 9.

Figure 10:
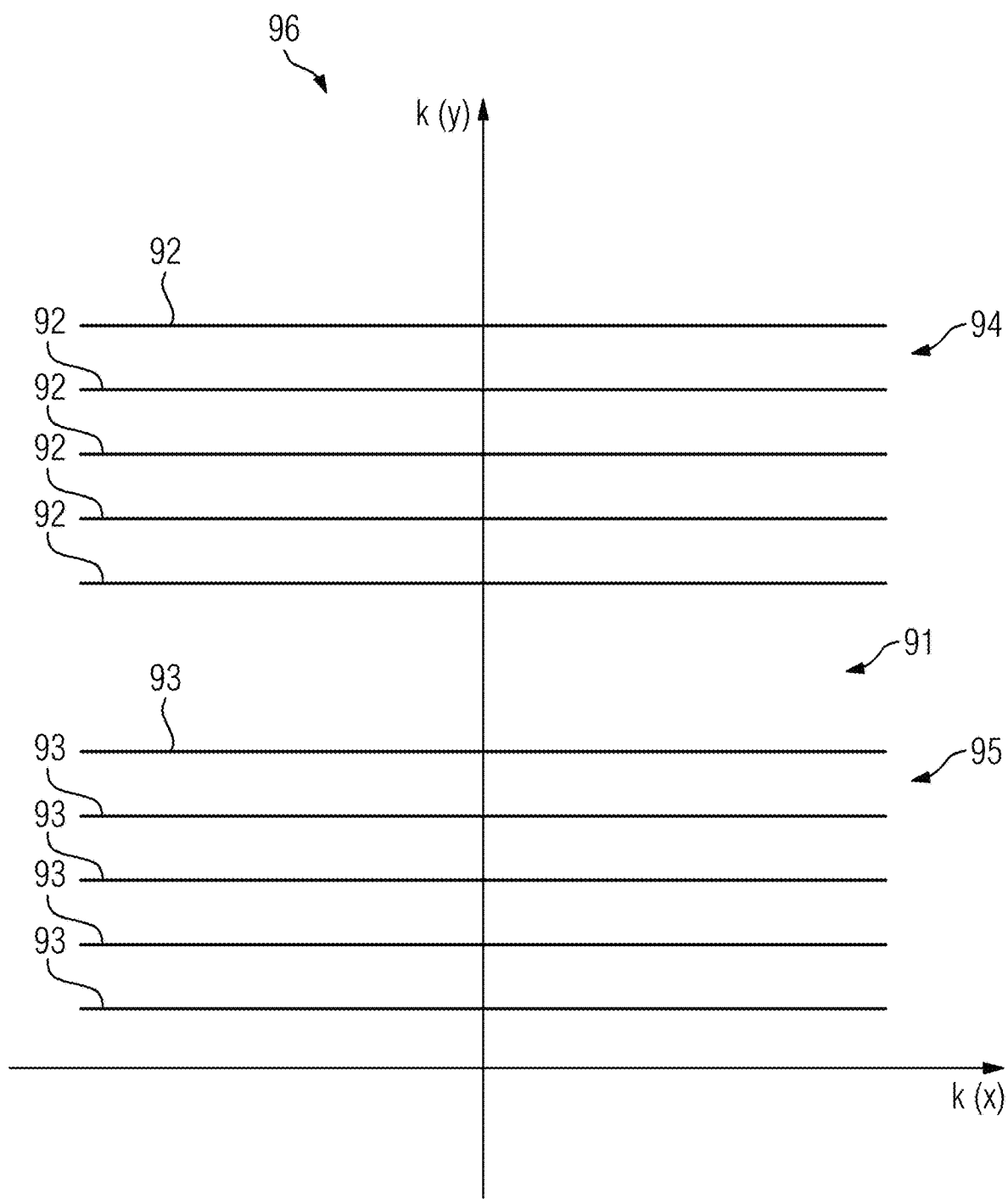
FIG. 10 depicts an example of a k-space segmented in phase encoding direction.

FIG. 10 depicts a k-space being acquired using a TSE sequence. A gap 91 occurs between k-space lines 92 and 93 between two segments 94 and 95. The k-space 96 is covered completely in readout direction in a partial measurement and is segmented in phase encoding direction. Correction factors cf1 to cf5 are applied to move the k-space lines 92 and 93 in phase encoding direction, which is also a type of gridding. In this example, the k-space is sampled having a constant density in readout direction and the k-space lines having constant distances within the segments 92 and 93. Only between the segments 92 and 93 there is an act with regard to the density.

Although the disclosure has been illustrated and described in greater detail by the exemplary embodiments, the disclosure is not restricted by these exemplary embodiments. Other variations may be derived herefrom by the person skilled in the art, without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for obtaining a correction factor to balance a mismatch between gradient moments, the method comprising:
   acquiring a magnetic resonance raw dataset through an acquisition of k-space of the magnetic resonance raw dataset in several partial measurements, wherein, in each partial measurement, several k-space lines are at least partially sampled by setting a given set of acquisition parameters, applying at least one radio frequency excitation pulse, applying a first gradient in a predetermined direction, applying a second gradient in the predetermined direction, and reading out magnetic resonance signals;
   changing the first gradient between at least two partial measurements;
   processing the magnetic resonance raw dataset several times to shifted raw datasets, wherein each time of the several times uses a different correction factor to shift the magnetic resonance signals in the k-space in the predetermined direction;
   creating several magnetic resonance image datasets out of the shifted raw datasets; and
   determining the correction factor with respect to the several magnetic resonance image datasets.

2. The method of claim 1, wherein the first gradient is a dephasing gradient in a readout direction.

3. The method of claim 1, wherein the second gradient is a readout gradient in a readout direction.

4. The method of claim 3, wherein the readout gradient has a sinusoidal form having at least one arc.

5. The method of claim 3, wherein the gradient moments or extreme values of arcs of a sinusoidal form of the readout gradient have constant values.

6. The method of claim 1, wherein k-space signals of one partial measurement only partially cover less than fully cover the k-space in a readout direction.

7. The method of claim 1, wherein k-space signals of one partial measurement completely cover the k-space in a phase encoding direction.

8. The method of claim 1, further comprising:
   combining echo signals acquired with a same gradient moment in a phase encoding direction to a combined k-space line.

9. The method of claim 8, further comprising:
   multiplying a position of the echo signals of a segment with the correction factor to provide a shifted position.

10. The method of claim 8, further comprising:
    overlapping the echo signals in the k-space in a readout direction.

11. The method of claim 1, further comprising:
    multiplying a position of echo signals of a segment with the correction factor to provide a shifted position.

12. The method of claim 1, further comprising:
    overlapping echo signals in the k-space in a readout direction.

13. The method of claim 1, wherein the shifted raw datasets are gridded to a Cartesian grid.

14. The method of claim 1, further comprising:
    acquiring an echo train having a plurality of echo signals in every partial measurement of the several partial measurements.

15. The method of claim 14, wherein each echo train in the several partial measurements has a same number of echo signals.

16. A non-transitory computer-readable data storage medium encoded with programming instructions, the storage medium configured to be loaded into a computer system of a magnetic resonance (MR) apparatus comprising a MR data acquisition scanner having a radio-frequency (RF) transmitter, a RF receiver, a gradient coil arrangement, and a memory, wherein the programming instructions, when executed on computer system, cause the MR apparatus to:
    acquire a magnetic resonance raw dataset through an acquisition of k-space of the magnetic resonance raw dataset in several partial measurements, wherein, in each partial measurement, several k-space lines are at least partially sampled by setting a given set of acquisition parameters, applying at least one radio frequency excitation pulse, applying a first gradient in a predetermined direction, applying a second gradient in the predetermined direction, and reading out magnetic resonance signals;
    change the first gradient between at least two partial measurements;
    process the magnetic resonance raw dataset several times to shifted raw datasets, wherein each time of the several times uses a different correction factor to shift the magnetic resonance signals in the k-space in the predetermined direction;
    create several magnetic resonance image datasets out of the shifted raw datasets; and
    determine a correction factor with respect to the several magnetic resonance image datasets.

17. A magnetic resonance (MR) apparatus comprising:
    a MR data acquisition scanner having a radio-frequency (RF) transmitter, a RF receiver, and a gradient coil arrangement;
    a memory configured to store parameter sets; and
    a computer having access to the memory and configured to read the parameter sets from the memory,
    wherein the computer is configured to:
        acquire a magnetic resonance raw dataset through an acquisition of k-space of the magnetic resonance raw dataset in several partial measurements, wherein, in each partial measurement, several k-space lines are at least partially sampled by setting a given set of acquisition parameters, applying at least one radio frequency excitation pulse, applying a first gradient in a predetermined direction, applying a second gradient in the predetermined direction, and reading out magnetic resonance signals;

change the first gradient between at least two partial measurements;

process the magnetic resonance raw dataset several times to shifted raw datasets, wherein each time of the several times uses a different correction factor to shift the magnetic resonance signals in the k-space in the predetermined direction;

create several magnetic resonance image datasets out of the shifted raw datasets; and determine a correction factor with respect to the several magnetic resonance image datasets.

* * * * *